US008164493B2

(12) United States Patent
Hsieh

(10) Patent No.: US 8,164,493 B2
(45) Date of Patent: Apr. 24, 2012

(54) HIGH-RESOLUTION CIRCULAR INTERPOLATION TIME-TO-DIGITAL CONVERTER

(75) Inventor: Hong-Yean Hsieh, Sunnyvale, CA (US)

(73) Assignee: Realtek Semiconductor Corporation, Hsinchu (TW)

( * ) Notice: Subject to any disclaimer, the term of this patent is extended or adjusted under 35 U.S.C. 154(b) by 614 days.

(21) Appl. No.: 12/418,351

(22) Filed: Apr. 3, 2009

(65) Prior Publication Data

US 2009/0296532 A1 Dec. 3, 2009

Related U.S. Application Data

(60) Provisional application No. 61/056,829, filed on May 29, 2008.

(51) Int. Cl.
*H03M 1/00* (2006.01)

(52) U.S. Cl. ......................... 341/110; 341/166; 341/155

(58) Field of Classification Search .................. 341/155, 341/156, 166, 157, 167; 327/269, 271, 272, 327/392, 393, 394
See application file for complete search history.

(56) References Cited

U.S. PATENT DOCUMENTS

| | | | | |
|---|---|---|---|---|
| 5,121,012 | A | 6/1992 | Orlov | |
| 5,777,326 | A | 7/1998 | Rockwood et al. | |
| 5,886,660 | A | 3/1999 | Loewenstein | |
| 6,429,693 | B1 | 8/2002 | Staszewski et al. | |
| 6,501,706 | B1 | 12/2002 | West | |
| 7,142,027 | B2 | 11/2006 | Lee et al. | |
| 7,205,924 | B2 * | 4/2007 | Vemulapalli et al. | 341/166 |
| 7,209,065 | B2 | 4/2007 | Wood | |
| 7,332,973 | B2 | 2/2008 | Lee et al. | |
| 7,427,940 | B2 | 9/2008 | Staszewski et al. | |
| 7,501,973 | B2 | 3/2009 | Choi et al. | |
| 7,522,084 | B2 * | 4/2009 | Huang et al. | 341/157 |

* cited by examiner

*Primary Examiner* — Jean B Jeanglaude
(74) *Attorney, Agent, or Firm* — Okamoto & Benedicto LLP

(57) ABSTRACT

A time-to-digital converter includes a circular delay chain, a phase interpolator, and a time-to-digital (TDC) core. The circular delay chain receives a first input clock and generates a first set of multi-phase clocks by propagating the first input clock through delay cells in the delay chain. The phase interpolator performs phase interpolation with a second input clock and another clock to generate a second set of multi-phase clocks. The other clock may be a delayed version of the second input clock. The TDC core uses the first and second set of multi-phase clocks to determine the time difference between the first and second input clocks.

20 Claims, 5 Drawing Sheets

HIGH-RESOLUTION CIRCULAR INTERPOLATION TIME-TO-DIGITAL CONVERTER

CROSS-REFERENCE TO RELATED APPLICATION

This application claims the benefit of U.S. Provisional Application No. 61/056,829, entitled "Circular Interpolation Time-to-Digital Converter," filed on May 29, 2008 by Hong-Yean Hsieh, which is incorporated herein by reference in its entirety.

BACKGROUND OF THE INVENTION

1. Field of the Invention

The present invention relates generally to electrical circuits, and more particularly but not exclusively to time-to-digital converters.

2. Description of the Background Art

Time-to-digital converters are widely used to measure the timing difference between two signals. As an example, a time-to-digital converter may receive a first signal, thereafter receive a second signal, and then output a digital signal indicative of the timing difference between the first and second signals. Characteristics of a time-to-digital converter include detection range, timing resolution, and non-linearity. Detection range is the largest timing difference that the time-to-digital converter can measure. A circular time-to-digital converter takes advantage of its re-circular nature to reduce the number of delay cells employed while increasing detection range. However, the minimum timing difference, i.e. timing resolution, which can be detected by the circular time-to-digital converter is still subject to the delay of each of its delay cells. Embodiments of the present invention pertain to a circular time-to-digital converter with improved timing resolution.

SUMMARY

In one embodiment, a time-to-digital converter includes a circular delay chain, a phase interpolator, and a time-to-digital (TDC) core. The circular delay chain receives a first input clock and generates a first set of multi-phase clocks by propagating the first input clock through delay cells in the delay chain. The phase interpolator performs phase interpolation with a second input clock and another clock to generate a second set of multi-phase clocks. The other clock may be a delayed version of the second input clock. The TDC core uses the first and second set of multi-phase clocks to determine the time difference between the first and second input clocks.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
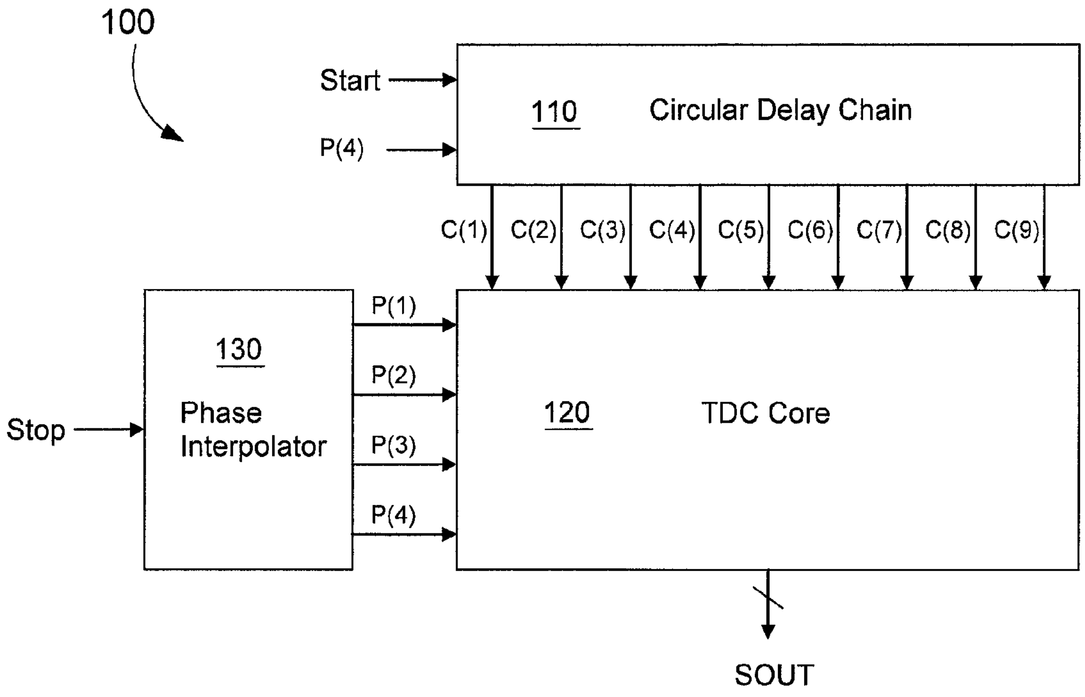
FIG. 1 schematically shows a time-to-digital converter in accordance with an embodiment of the present invention.
Figure 2:
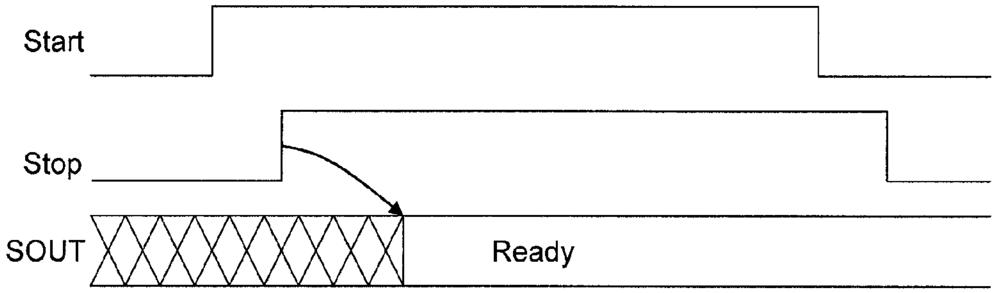
FIG. 2 shows a timing diagram of the time-to-digital converter of FIG. 1.

FIG. 1 schematically shows a time-to-digital converter (TDC) 100 in accordance with an embodiment of the present invention. In the example of FIG. 1, the TDC 100 includes a circular delay chain 110, a logic circuit in the form of a TDC core 120, and a phase interpolator 130. In one embodiment, the TDC 100 is configured to receive a first input clock (Start signal in FIG. 1) in the circular delay chain 110, to receive a second input clock (Stop signal in FIG. 1) in the phase interpolator 130, and generate a TDC digital output signal (digital output SOUT in FIG. 1) representing the timing difference between rising edges of the first and second input clocks. This is shown in the timing diagram of FIG. 2, where the TDC 100 measures the timing difference between the Start signal and the Stop signal to generate the digital output SOUT. The digital output SOUT is a digitized representation of the timing difference between the rising edges of the Start and Stop signals. The digital output SOUT is a multi-bit digital value, with its bit width dependent on the desired detection range.

In one embodiment, the circular delay chain 110 is configured to receive the first input clock and the last phase of a second plurality of multi-phase clock from the phase interpolator 130, and generate a first plurality of multi-phase clock by propagating the first input clock through a chain of delay cells and re-circulating the last clock phase from the chain of delay cells back to the input of the first delay cell. In the example of FIG. 1, the circular delay chain 110 receives the Start signal and propagates it through a chain of delay cells (see delay cells 205 of FIG. 3) to generate the multi-phase clocks C(1) to C(9), with successive clocks C(n) and C(n+1) being separated by a time difference dictated by the delay through the corresponding delay cell.

In one embodiment, the phase interpolator 130 is configured to receive the second input clock and generate the second plurality of multi-phase clocks by passing the second input clock through a delay cell that is same as used in the circular delay chain 110 to generate a delayed clock and thereafter performing phase interpolation with the second input clock and the delayed clock. In the example of FIG. 1, the phase interpolator 130 passes the second input clock through a delay cell (see delay cell 405 of FIG. 4) to generate the delayed clock, which is a delayed version of the second input clock. The phase interpolator 130 generates the multi-phase clocks P(1) to P(4) by phase interpolation using the second input clock and the delayed clock.

In one embodiment, the TDC core 120 is configured to receive the first plurality of multi-phase clocks from the circular delay chain 110 and the second plurality of multi-phase clocks from the phase interpolator 130, and generate the digital output SOUT that represents the timing difference between the rising edges of the first input clock and the second input clock.

Figure 3:
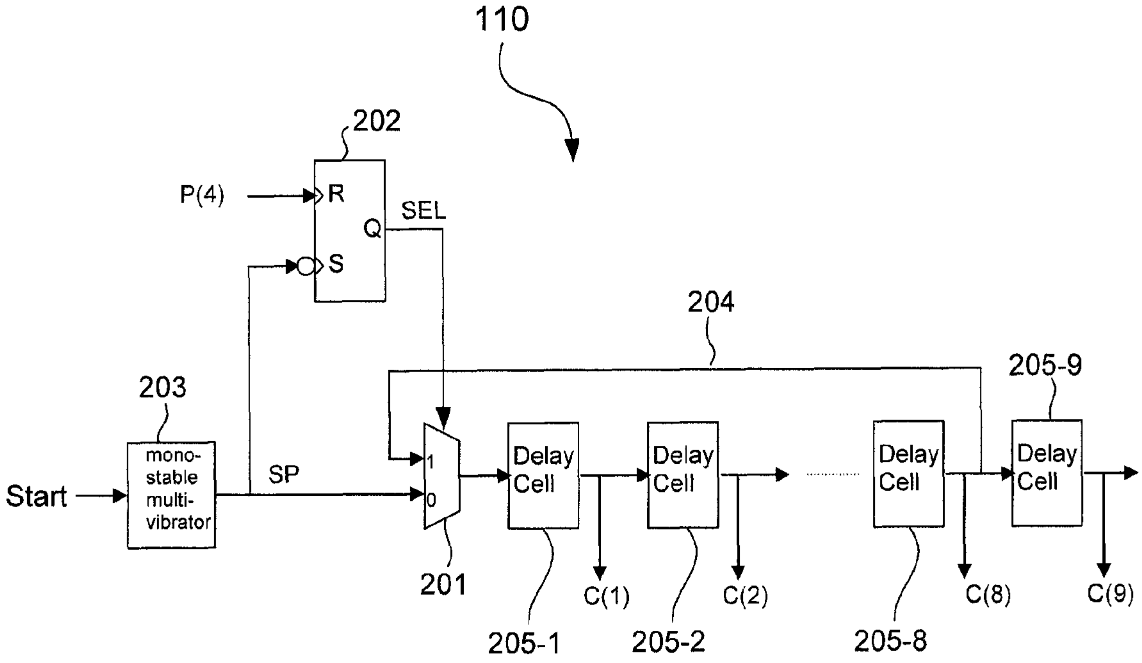
FIG. 3 schematically shows details of a circular delay chain in accordance with an embodiment of the present invention.

FIG. 3 schematically shows details of the circular delay chain 110 in accordance with an embodiment of the present invention. In one embodiment, the circular delay chain 110 receives the first input clock and the last phase clock of the second plurality of multi-phase clocks generated by the phase interpolator 130, and generates the first plurality of multi-phase clocks. In the example of FIG. 3, the circular delay chain 110 comprises a delay chain comprising delay cells 205 (i.e., 205-1 to 205-9), a multiplexer 201, an edge-triggered latching device 202, and a mono-stable multi-vibrator 203. The circular delay chain 110 receives the first input clock, which is the Start signal in this example, and generates the first plurality of 9-phase clocks C(1) to C(9). The first 8-phase clocks, i.e., clocks C(1) to C(8), are evenly distributed multi-phase clocks whose timing difference is equal to a delay time Δ of a delay cell 205. The clock just before the last clock, i.e., the eighth clock C(8), may be re-circulated back to the input of the first delay cell 205-1 to re-circulate a rising edge of the first input clock. The ninth delay cell 205-9 is a matching delay cell for having an equal loading for the first eight delay cells 205-1 to 205-8. As will be more apparent below, the clock C(9) is further used to drive an incremental counter in the TDC core 120.

The circular delay chain 110 has two states that are decided by a signal SEL, which is connected from the output of the edge-triggered latching device 202 to the select input of the multiplexer 201. The signal SEL controls the opening and closing of the recirculation loop around the circular delay chain 110. The recirculation loop goes through the delay cells 205-1 to 205-8, from the delay cell 205-8 to the multiplexer 201 (see line 204), and back to the delay cell 205-1. The multiplexer 201 opens the recirculation loop when the signal SEL is a binary zero. When the signal SEL is a binary one, the multiplexer 201 closes the recirculation loop, thereby allowing the clock C(8) to re-circulate back to the input of the first delay cell 205-1.

The value of the signal SEL is decided by the intermediate clock SP and the last phase clock P(4) of the edge-triggered latching device 202. The intermediate clock SP is generated by the mono-stable multi-vibrator 203. The mono-stable multi-vibrator 203 ensures that every rising edge of the Start signal triggers a pulse at SP with a fixed pulse width regardless of the pulse width of the Start signal.

The edge-triggered latching device 202 that has two input pins R and S, and an output pin Q, where R is a rising edge-triggered pin and S is a falling edge-triggered pin. If a rising edge shows at input pin R, the output pin Q is set to binary zero regardless of the value of the signal at the input pin S. If a falling edge shows at the input pin S when the value of the signal at the input pin R is a binary zero, the output pin Q is set to a binary one. Otherwise, the value of the signal at the output pin Q is set to a binary zero.

Initially, the recirculation loop is open because of a rising edge of the clock P(4) in the previous cycle. When the Start signal is applied to the mono-stable multi-vibrator 203, a rising edge of the intermediate clock SP propagates through the delay chain with the loop open. The mono-stable multi-vibrator 203 may be configured such that the intermediate clock SP has a pulse width equal to approximately half of the total delay time of the delay chain comprising the delay cells 205. If the clock P(4) has not changed to a binary one, at approximately half of the total delay time of the delay chain, the clock SP changes to a binary zero, thereby setting the output pin Q to a binary one to close the recirculation loop. After the clock P(4) changes to a binary one, the recirculation loop is broken and the signal propagating through the delay chain is not re-circulated back to the input of the first delay cell 205-1.

Each pass through the delay chain (i.e., one signal propagation through the delay cells 205-1 to 205-8) represents one unit of timing value. For example, assuming the delay chain has a total delay of 1 ns, one pass of a signal through the delay cells 205-1 to 205-8 represents a measurement of 1 ns. A timing difference greater than 3 ns between the first and second input clocks will thus require at least three passes through the delay chain in that example. As will be more apparent below, the number of passes through the delay chain is communicated by the clock C(9) to the TDC core 120. In the TDC core 120, a counter is incremented by the clock C(9) to keep track of the number of passes through the delay chain.

Figure 4:
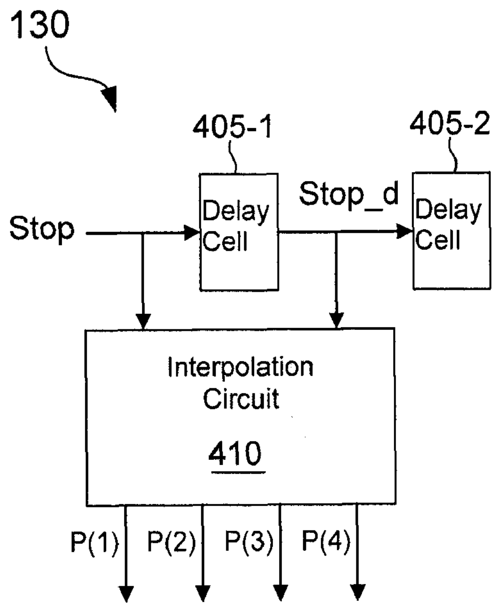
FIG. 4 schematically shows further details of a phase interpolator in accordance with an embodiment of the present invention.

FIG. 4 schematically shows further details of the phase interpolator 130 in accordance with an embodiment of the present invention. In one embodiment, the phase interpolator 130 receives the second input clock and generates a second plurality of multi-phase clocks. In the example of FIG. 4, the phase interpolator 130 comprises delay cells 405 (i.e., 405-1 and 405-2) and a 4-phase interpolation circuit 410. Each delay cell 405 is nominally the same as a delay cell 205 in the circular delay chain 110, and thus also has a delay time Δ. The second input clock, which is the Stop signal in this example, passes through the delay cells 405-1 and 405-2. The delay cell 405-1 generates a delayed clock Stop_d whereas the delay cell 405-2 is a matching delay cell. Note that the clock Stop_d is a delayed version of the Stop signal. Stop and Stop_d are coupled to a 4-phase interpolation circuit 410, which generates the second plurality of 4-phase clocks P(1) to P(4) by interpolating Stop and Stop_d. The 4-phase interpolation circuit 410 generates 4-phase clocks P(1) to P(4) to be evenly distributed in time with timing difference equal to one-fourth of the delay time Δ. The 4-phase clocks P(1) to P(4) are coupled to the input of the TDC core 120 (see FIG. 1). The last phase clock P(4) is also coupled to the circular delay chain 110 as previously described.

Figure 5:
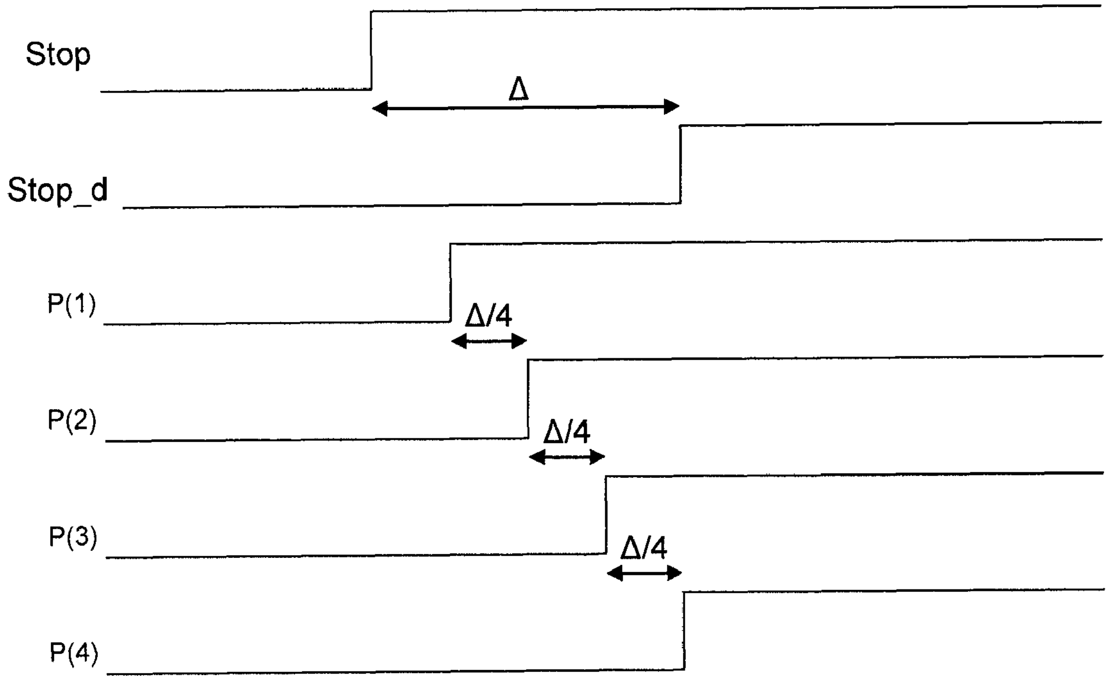
FIG. 5 shows a timing diagram of the phase interpolator of FIG. 4 in accordance with an embodiment of the present invention.

FIG. 5 shows a timing diagram of the phase interpolator 130 in accordance with an embodiment of the present invention. Because the timing difference between the Stop and Stop_d is Δ (i.e., the delay through the delay cell 405-1), and the 4-phase interpolation circuit 410 performs interpolation using Stop and Stop_d to generate four phases, with each successive clocks P(n) and P(n+1) being separated by Δ/4 as shown in FIG. 5.

Figure 6:
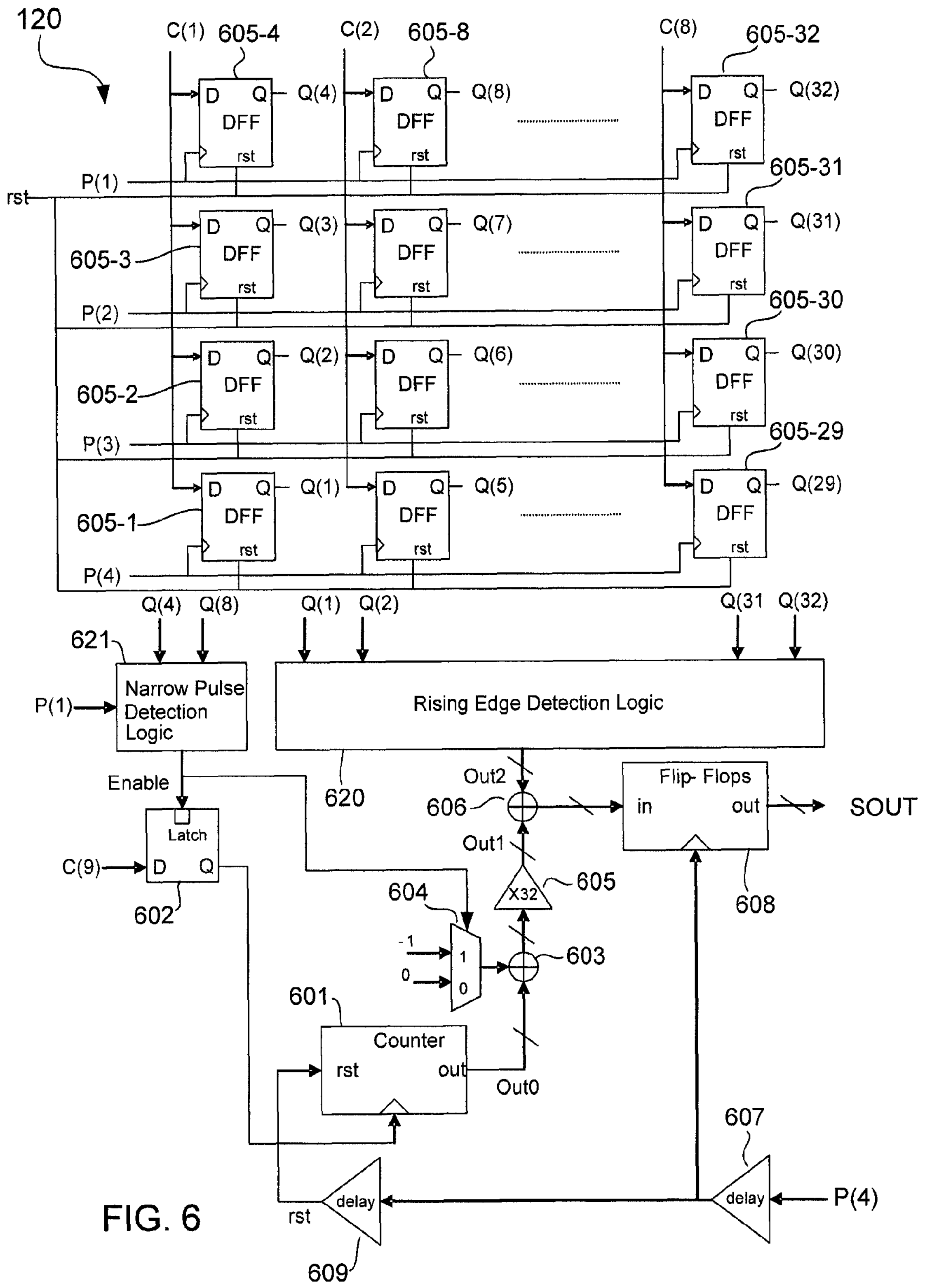
FIG. 6 schematically shows details of a time-to-digital core in accordance with an embodiment of the present invention.

FIG. 6 schematically shows details of the TDC core 120 in accordance with an embodiment of the present invention. In one embodiment, the TDC core 120 receives the first plurality of multi-phase clocks from the circular delay chain 110 and the second plurality of multi-phase clocks from the phase interpolator 130, and generates a digital output that represents the timing difference between the rising edges of the first and second input clocks. In the example of FIG. 6, the TDC core 120 comprises an array of flip-flops 605 (i.e., 605-1, 605-2, . . . ,605-32), a rising edge detection logic 620, a narrow pulse detection logic 621, an incremental counter 601, a level-sensitive transparent latch 602, a multiplexer 604, adders 603 and 606, a multiplier 605, delay elements 607 and 609, and holding flip-flops 608.

In the example of FIG. 6, the TDC core 120 receives the 9-phase clocks C(1) to C(9) from the circular delay chain 110 and receives the 4-phase clocks P(1) to P(4) from the phase interpolator 130, and generates the digital output SOUT that represents the timing difference between the rising edges of the Start and Stop signals (see FIG. 1).

The 8-phase clocks C(1) to C(8) generated by the circular delay chain 110 have a resolution of Δ, whereas the 4-phase clocks P(1) to P(4) generated by the phase interpolator 130 have a resolution of Δ/4 (see also FIG. 5). By utilizing the 4-phase clocks P(1) to P(4) from the phase interpolator 130 to sample the 8-phase clocks C(1) to C(8) from the circular delay chain 110, four snapshots of the signal in the delay chain are taken. In the example of FIG. 6, a snapshot of the clock C(1) are sampled by the clocks P(1), P(2), P(3), and P(4), a snapshot of the clock C(2) are sampled by the clocks P(1), P(2), P(3), and P(4), and so on. This results in 8 samples per snapshot, with each sample being stored in a corresponding flip-flop 605. For example, the sample of clock C(1) taken by the clock P(1) is represented by the Q(4) output of the flip-flop 605-1, the sample of clock C(2) taken by the clock P(1) is represented by the Q(8) output of the flip-flop 605-5, and so on. A total of four snapshots result in 32 samples Q(1) to Q(32), which are input to the rising edge detection logic 620. The rising edge detection logic 620 determines the position of the rising edge of the Start signal in the delay chain by examining Q(1) to Q(32). The position of the rising edge of the Start signal in the delay chain indicates the number of delay cells 605 it has traversed in the last round. It represents the remainder of the timing difference between the rising edges of the Start and Stop signals and is equal to the total time difference minus the traversed time of the previous circulating rounds. This remainder is generated by the rising edge detection logic 620 as a second digital value Out2.

By taking one snapshot, one instance of the Start signal in the delay chain is captured and its resolution is equal to a the delay time Δ of a delay cell. However, the transient waveform propagating between the input and output nodes of each single delay cell is unknown. The transient waveform can be captured after more successive snapshots are taken. In the example of FIG. 6, a total of four snapshots with delay times of Δ/4 are taken. Therefore the timing resolution of the TDC 100 is Δ/4. The rising edge detection logic 620 is used to detect the position of the rising edge of the Start signal in the delay chain and generate a second digital value Out2.

When a rising edge of the 4-phase clocks from the phase interpolator 130 occurs, a vector of flip-flops 605 are used to take a snapshot of the signal in the delay chain. A total of four snapshots are taken and therefore an array of flip-flops 605 with four vectors is employed. The rising edge detection logic 620 may determine the position of the rising edge using the following algorithm:

```
if (Q(1)==1 & Q(2)==0) Out2 = 1,
else if (Q(2)==1 & Q(3)==0) Out2 = 2,
else if (Q(3)==1 & Q(4)==0) Out2 = 3,
.
.
.
else if (Q(N)==1 & Q(N+1)==0) Out2 = N,
.
.
.
else if (Q(31)==1 & Q(32)==0) Out2 = 31,
else if (Q(32)==1 & Q(1)==0) Out2 = 32,
else Out2 = 0;
```

The incremental counter 601 increases its count Out0 by one whenever a rising edge of the Start signal propagates through the delay chain once. The propagation of the Start signal through the delay chain is represented by the clock C(9), which is received by the latch 602. Upon the arrival of the clock P(4), which is the last phase clock of the second plurality of multi-phase clocks, the recirculation loop is open and multiple snapshots of the first plurality of multi-phase clocks in the delay chain are taken. A digital value Out0 is generated and represents how many rounds a rising edge of the Start signal propagates through the delay chain. The digital value Out0 may or may not include the last round. If the narrow pulse detection logic 621 determines that the pulse leaving the next to last delay cell (i.e., delay cell 205-8) and re-circulating back to the first delay cell in the delay chain (i.e., delay cell 205-1) is too narrow, the digital value Out0 does not include the last round. Otherwise, the digital value Out0 includes the last round.

The incremental counter 601 counts the circulating rounds of a rising edge of the Start signal, i.e., first input clock. The clock pin of the incremental counter 601 is driven by the clock C(9) through a transparent latch 602. The transparent latch 602 is transparent when the value at its clock pin is a binary one and is opaque when the value at its clock pin is a binary zero. The clock input pin of the transparent latch 602 is driven by the output signal Enable from the narrow pulse detection logic 621. A narrow pulse may exist because of a sudden broken recirculation loop whenever a rising edge of the clock P(4) shows. If a narrow pulse is detected, the transparent latch 602 is disabled and the last round of the rising edge propagating through the delay chain is not counted by the incremental counter 601. In the example of FIG. 6, a narrow pulse is deemed to exist if the following conditions are satisfied: (Q(4)==1) & (Q(8)==0) & (P(1)==1). In terms of the Enable signal,

```
if (Q(4)==1 & Q(8)==0 & P(1) == 1) Enable = 0,
else Enable == 1;
```

As can be appreciated, many different sets of signals can also be chosen to detect a narrow pulse. The choices of signal sets depend on the conditions that allow the narrow pulse to be filtered out of the delay chain.

Another algorithm that may be used by the narrow pulse detection logic 621 to detect a narrow pulse is as follows:

```
if ((Q(4)==1 & Q(8)==0 & P(1) == 1) or
    (Q(3)==1 & Q(7)==0 & P(2) == 1) or
    (Q(2)==1 & Q(6)==0 & P(3) == 1) or
    (Q(1)==1 & Q(5)==0 & P(4) == 1)) Enable = 0,
else Enable == 1;
```

If the narrow pulse detection logic 621 asserts its output signal Enable, the final count Out0 of the incremental counter 601 is subtracted by one using the multiplexer 604. This is illustrated in FIG. 6 where the multiplexer 604 outputs a minus one (i.e., −1) when the output signal Enable is a binary one. If the signal Enable is not asserted, the final content of the incremental counter is not subtracted by one. This is illustrated in FIG. 6 where the multiplexer 604 outputs a zero when the output signal Enable is a binary zero. The resultant value from the adder 603 is multiplied by a constant value of 32 using the multiplier 605 to obtain the first digital value Out1. The constant value 32 represents the total of number of samples taken for all four snapshots.

In the example of FIG. 6, the rising edge detection logic 620 generates the second digital value Out2. The first digital value Out1 and the second digital value Out2 are added by the adder 606 to generate the digital output SOUT. Note that the flip-flops 608 comprise a plurality of flip-flops, with each flip-flop storing a bit of the multi-bit digital output SOUT. The flip-flops 608 are illustrated as a single block for clarity of illustration. The delay element 407 delays the clock P(4) by a specific amount such that SOUT is ready to be sampled into the flip-flops 608. After another delay by the delay element 609, the incremental counter 601 and the array of flip-flops 605 are reset to zero.

The TDC 100 may be employed in a variety of time measurement applications. For example, the TDC 100 may be employed in a phase lock loop, where the first input clock may be from a feedback loop and the second input clock may be an incoming clock. The TDC 100 may be employed to determine the time difference between the feedback clock and the incoming clock, and minimize the timing difference to lock the feedback clock with the incoming clock.

There may exist some constant delays from the Start signal to the intermediate clock SP, and from the Stop signal to the last phase clock P(4). In most cases, a constant delay offset does not need to be corrected whenever the TDC 100 is placed in a closed loop system. The closed loop system can automatically compensate for constant delays. If the constant delay offset has to be corrected, it can be calibrated by driving a clock waveform to both the first and the second input clocks, which are the Start and Stop signals in this example. This calibration technique is now described with reference to FIG. 7.

Figure 7:
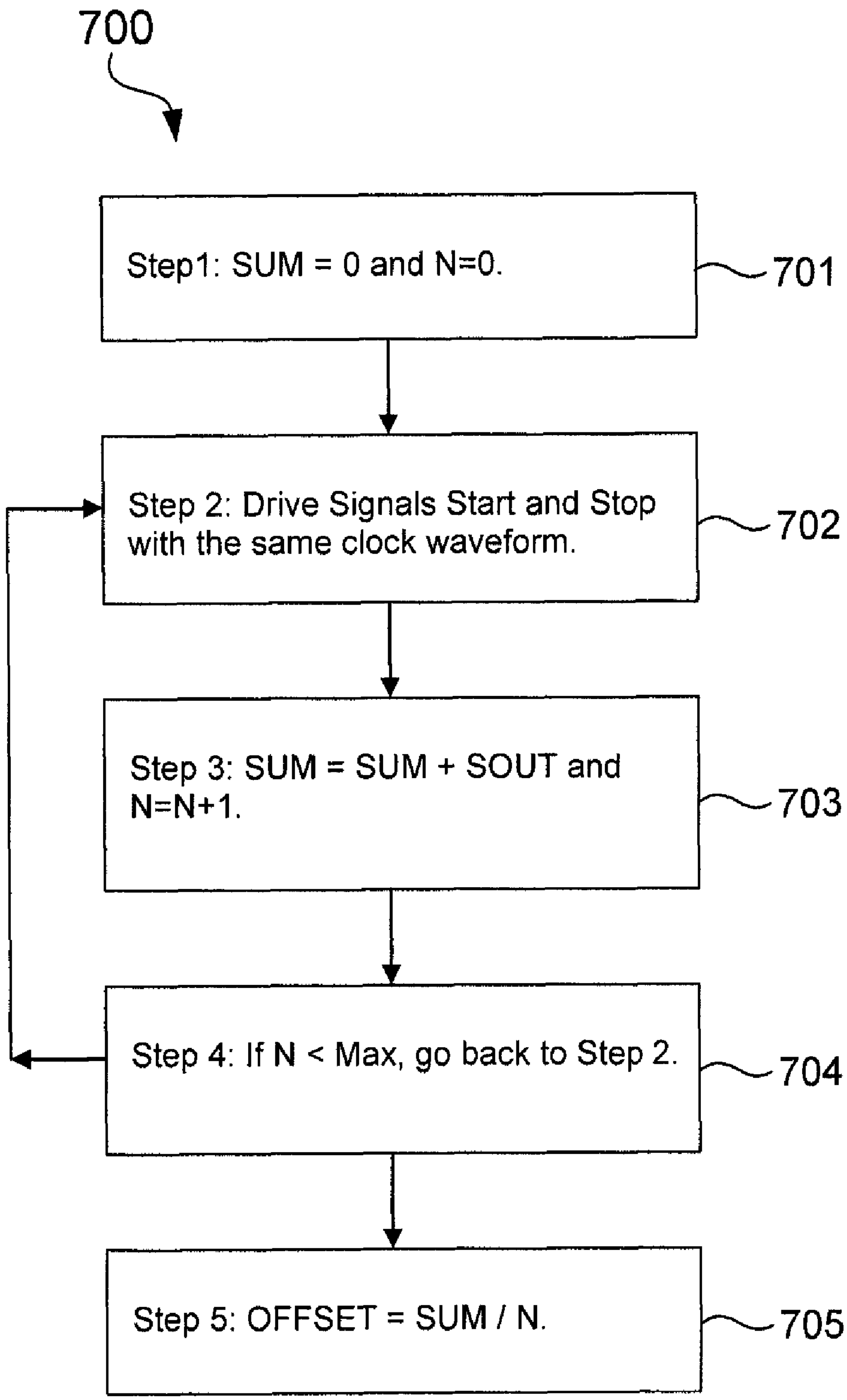
FIG. 7 schematically shows a method of calibrating a constant delay for a time-to-digital converter, in accordance with an embodiment of the present invention.

FIG. 7 schematically shows a method of calibrating a constant delay for a time-to-digital converter, in accordance with an embodiment of the present invention. In the method 700, variables SUM and N are both initialized to zero (step 701). The Start and Stop signals are driven using the same clock waveform (step 702). The variable SUM is set to SUM+the digital output SOUT from the TDC core 120, and the variable N is incremented by 1 (step 703). If N is less than MAX, steps 702 and 703 are repeated, with MAX being the total number of measurements (step 704). When step 704 is satisfied, the calibrated OFFSET is determined as SUM divided by N. The calibrated OFFSET can then be subtracted from the digital output SOUT of the TDC core 120 to compensate for constant delays.

A high-resolution circular interpolation time-to-digital converter has been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A time-to-digital converter comprising:
- a circular delay chain configured to receive a first input clock and generate a first plurality of multi-phase clocks;
- a phase interpolator configured to receive a second input clock and generate a second plurality of multi-phase clocks, the second plurality of multi-phase clocks being interpolated by the phase interpolator from the second input clock and another clock; and
- a time-to-digital (TDC) core configured to receive the first plurality of multi-phase clocks and the second plurality of multi-phase clocks to generate a digital output value indicating a timing difference between the first and second input clocks.

2. The time-to-digital converter of claim 1 wherein the circular delay chain comprises a plurality of delay cells with each delay cell having a delay time Δ.

3. The time-to-digital converter of claim 2 wherein the other clock is a version of the second input clock delayed by the delay time Δ.

4. The time-to-digital converter of claim 1 wherein the TDC core is configured to sample each of the first plurality of multi-phase clocks using the second plurality of multi-phase clocks.

5. The time-to-digital converter of claim 1 wherein the circular delay chain comprises a plurality of delay cells wherein a first delay cell in the plurality of delay cells is configured to receive a clock output re-circulated from another delay cell in the plurality of delay cells.

6. The time-to-digital converter of claim 5 wherein the TDC core includes a counter configured to count a number of times a pulse of the first input clock has passed through a delay chain that includes the plurality of delay cells.

7. The time-to-digital converter of claim 5 wherein the TDC core further includes a narrow pulse detection logic configured to indicate whether or not to include the last re-circulated clock output in a count of timing difference between the first and second input clocks.

8. The time-to-digital converter of claim 1 wherein the time-to-digital converter is configured to generate samples of the first input clock a number of times equal to a number of clocks in the first plurality of multi-phase clocks multiplied by a number clocks in the second plurality of multi-phase clocks.

9. The time-to-digital converter of claim 1 wherein successive clocks in the first plurality of multi-phase clocks are separated by a delay time Δ.

10. The time-to-digital converter of claim 9 wherein successive clocks in the second plurality of multi-phase clocks are separated by a delay time equal to the delay time Δ divided by a number of clocks in the second plurality of multi-phase clocks.

11. A method of determining a delay time between a first input clock and a second input clock, the method comprising:
- receiving a first input clock to generate a first plurality of multi-phase clocks;
- receiving a second input clock;
- performing phase interpolation using the second input clock and another clock to generate a second plurality of multi-phase clocks; and
- using the first plurality of multi-phase clocks and the second plurality of multi-phase clocks to generate a digital value representing a time difference between the first input clock and the second input clock.

12. The method of claim 11 wherein the other clock is a delayed version of the second input clock.

13. The method of claim 11 wherein the first plurality of multi-phase clocks are generated by propagating the first input clock through a delay chain comprising a plurality of delay cells.

14. The method of claim 11 wherein the plurality of delay cells each has a delay time Δ, and the other clock is generated by delaying the second input clock by the delay time Δ.

15. The method of claim 11 wherein the digital value is generated by sampling each of the first plurality of multi-phase clocks using the second plurality of multi-phase clocks.

16. The method of claim 11 wherein successive clocks in the first plurality of multi-phase are separated by a delay time Δ.

17. The method of claim 16 wherein successive clocks in the second plurality of multi-phase clocks are separated by the delay time Δ divided by a number of clocks in the second plurality of multi-phase clocks.

18. A time-to-digital converter comprising:

a plurality of delay cells configured to receive a first input clock to generate a first plurality of multi-phase clocks;

a phase interpolator configured to generate a second plurality of multi-phase clocks by performing phase interpolation with the second input clock and another clock; and logic configured to generate a digital value indicating a time difference between the first input clock and the second input clock based on the first and second plurality of multi-phase clocks.

19. The time-to-digital converter of claim 18 wherein the other clock is generated by delaying the second input clock by a delay time.

20. The time-to-digital converter of claim 19 wherein successive clocks in the first plurality of multi-phase clocks are separated by the delay time.

* * * * *